United States Patent
Ahmadi

(10) Patent No.: US 10,917,049 B2
(45) Date of Patent: Feb. 9, 2021

(54) CLASS-E POWER OSCILLATOR

(71) Applicant: Mohammad Mahdi Ahmadi, Tehran (IR)

(72) Inventor: Mohammad Mahdi Ahmadi, Tehran (IR)

(73) Assignees: AMIRKABIR UNIVERSITY OF TECHNOLOGY, Tehran (IR); Mohammad Mahdi Ahmadi, Tehran (IR)

( * ) Notice: Subject to any disclaimer, the term of this patent is extended or adjusted under 35 U.S.C. 154(b) by 0 days.

(21) Appl. No.: 16/517,885

(22) Filed: Jul. 22, 2019

(65) Prior Publication Data
US 2020/0059198 A1 Feb. 20, 2020

Related U.S. Application Data

(60) Provisional application No. 62/701,797, filed on Jul. 22, 2018.

(51) Int. Cl.
*H03B 1/02* (2006.01)
*H03B 5/24* (2006.01)
*H03F 3/217* (2006.01)
*H03F 1/02* (2006.01)

(52) U.S. Cl.
CPC ............ *H03F 1/0205* (2013.01); *H03B 1/02* (2013.01); *H03B 5/24* (2013.01); *H03F 3/2176* (2013.01); *H03F 2200/129* (2013.01)

(58) Field of Classification Search
CPC .... H03B 1/02; H03B 5/20; H03B 5/24; H03F 1/0205; H03F 3/2176; H03F 2200/129
See application file for complete search history.

(56) References Cited

U.S. PATENT DOCUMENTS

| 7,474,149 B2 * | 1/2009 | Snelgrove | H03F 1/0205 330/129 |
| 2013/0272545 A1 * | 10/2013 | Kinyua | H03F 1/0205 381/120 |

\* cited by examiner

*Primary Examiner* — Levi Gannon
(74) *Attorney, Agent, or Firm* — Bajwa IP Law Firm; Haris Zaheer Bajwa

(57) ABSTRACT

A class-E power oscillator (PO) is disclosed. The class-E PO includes a first inductor, a switch, a first capacitor, a resonant circuit, and a feedback network. The first inductor is coupled in series to a first power supply. The switch is connected between the first inductor and a primary common node. The first capacitor is connected between the first inductor and the primary common node. The resonant circuit includes a second inductor, a second capacitor, and a resistor. The second inductor is connected between the first inductor and the primary common node. The second capacitor is connected between the first inductor and the primary common node, and is coupled in series to the second inductor. The resistor is connected between the first inductor and the primary common node, and is coupled in series to the second inductor. The feedback network is connected between the switch and a feedback node. The feedback node is located between the second inductor and the second capacitor. The feedback network is configured to periodically turn the switch on and off based on a resonance frequency of the resonant circuit.

19 Claims, 17 Drawing Sheets

CLASS-E POWER OSCILLATOR

CROSS-REFERENCE TO RELATED APPLICATION

This application claims the benefit of priority from U.S. Provisional Patent Application Ser. No. 62/701,797, filed on Jul. 22, 2018, and entitled "SELF-TUNED CLASS-E POWER OSCILLATOR," which is incorporated herein by reference in its entirety.

TECHNICAL FIELD

The present disclosure generally relates to power amplifiers, and particularly, to power oscillators.

BACKGROUND

Class-E power amplifiers (PAs) are widely used in numerous applications, including DC/AC inverters, DC/DC converters, wireless communication, and wireless power transfer systems. Class-E PAs, if tuned properly, can achieve high efficiencies. In a class-E PA, values of circuit components should be chosen such that switch waveforms of the class-E PA satisfy zero-voltage switching (ZVS) and zero-voltage-derivative switching (ZVDS) conditions. In such a case, it is said that the class-E PA is in its "nominal" condition. There is only one switching frequency that can maintain the class-E PA at its nominal conditions. This switching frequency is usually called nominal class-E frequency of the PA.

If a mismatch exists between the switching frequency and the nominal class-E frequency, output power and efficiency of the PA may considerably decrease. Small variations in circuit components may result in a frequency mismatch, and consequently significant power loss. To resolve this issue, the switching frequency may be adjusted based on a feedback obtained from an output signal of the PA. Depending on the node from which the feedback signal is obtained, the feedback network may provide a certain amount of phase shift and a certain amount of attenuation (amplification) such that the phase shift in the entire oscillation circuit loop is −n360°, where n is a natural number. This may convert the class-E PA to a class-E power oscillator (PO).

There exist a number of issues with conventional class-E POs. First, any change in values of circuit components (including the feedback network components) may cause large degradation in the output power or power efficiency. Second, the phase shift sensitivity of the feedback network to frequency and also to component values in the feedback network may cause the PO to stop oscillation if a value of one of circuit components changes. Third, a high-precision estimate of an input capacitance of a switch of the class-E PO is needed. Fourth, internal switch capacitances may significantly vary in different switches, which makes the estimation difficult and time-consuming, in addition to making the circuit sensitive to a utilized switch.

There is, therefore, a need for a class-E PO with a low sensitivity to variations of component values. There is also a need for a class-E PO with a simple feedback network structure that provides high efficiency and high robustness against design variations of circuit components.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary class-E power oscillator (PO). An exemplary class-E PO may include a first inductor, a switch, a first capacitor, a resonant circuit, and a feedback network. The first inductor may be coupled in series to a first power supply. The switch may be connected between the first inductor and a primary common node. The primary common node may be connected to one of a second power supply or ground. The first capacitor may be connected between the first inductor and the primary common node.

In an exemplary embodiment, the resonant circuit may include a second inductor, a second capacitor, and a resistor. The second inductor may be connected between the first inductor and the primary common node. In an exemplary embodiment, the second capacitor may be connected between the first inductor and the primary common node, and may be coupled in series to the second inductor. In an exemplary embodiment, the resistor may be connected between the first inductor and the primary common node, and may be coupled in series to the second inductor. In an exemplary embodiment, the feedback network may be connected between the switch and a feedback node. The feedback node may be located between the second inductor and the second capacitor.

In an exemplary embodiment, the feedback network may include an RC circuit and may be configured to periodically turn the switch on and off based on a resonance frequency of the resonant circuit. An exemplary class-E PO may further include a driver circuit. An exemplary driver circuit may be configured to couple the feedback network to the switch. In an exemplary embodiment, the driver circuit may include a buffer. In an exemplary embodiment, the second inductor may be connected between the first inductor and the feedback node.

In an exemplary embodiment, the driver circuit may include an inverter. In an exemplary embodiment, the second capacitor may be connected between the first inductor and the feedback node. In an exemplary embodiment, the driver circuit may further include a drive resistor and a drive capacitor. In an exemplary embodiment, the drive resistor may be coupled in parallel to the inverter. In an exemplary embodiment, the drive capacitor may be configured to couple the feedback network to the inverter.

In an exemplary embodiment, the switch may include one of a field-effect transistor (FET) or a bipolar junction transistor (BJT). In an exemplary embodiment, the FET may include a metal-oxide-semiconductor field-effect transistor (MOSFET). An exemplary MOSFET may include a gate, a drain, and a source. In an exemplary embodiment, the gate may be connected to an output terminal of the driver circuit. In an exemplary embodiment, the drain may be connected to the first inductor. In an exemplary embodiment, the source may be connected to the primary common node.

In an exemplary embodiment, the BJT may include a base, a collector, and an emitter. In an exemplary embodiment, the base may be connected to an output terminal of the driver circuit. In an exemplary embodiment, the collector may be connected to the first inductor. In an exemplary embodiment, the emitter may be connected to the primary common node.

In an exemplary embodiment, the feedback network may include a feedback input terminal, a feedback output terminal, a first feedback resistor, and a feedback capacitor. An exemplary feedback input terminal may be connected to the feedback node. An exemplary feedback output terminal may be coupled to the driver circuit. In an exemplary embodiment, the feedback capacitor may be connected between the feedback input terminal and a secondary common node. In an exemplary embodiment, the secondary common node may be connected to one of a third power supply or ground. In an exemplary embodiment, the first feedback resistor may be connected between the feedback input terminal and the secondary common node. In an exemplary embodiment, one of the feedback capacitor or the first feedback resistor may be connected between the feedback input terminal and the feedback output terminal. In an exemplary embodiment, one of the feedback capacitor or the first feedback resistor may be connected between the feedback output terminal and the secondary common node.

In an exemplary embodiment, the feedback network may further include a second feedback resistor. The second feedback resistor may be connected in parallel with the feedback capacitor. In an exemplary embodiment, the feedback network may further include a third feedback resistor. In an exemplary embodiment, the third feedback resistor may be connected between the feedback output terminal and a fourth power supply.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown, but is to be accorded the widest possible scope consistent with the principles and features disclosed herein.

Herein are disclosed exemplary class-E power oscillators and methods for reducing sensitivities of specifications of class-E power oscillators (POs) to values of circuit components. An exemplary class-E PO may include an RLC resonant circuit and a low-quality (also called low-Q) RC feedback network. A feedback may be obtained from a node between a capacitor and an inductor of the RLC resonant circuit, where signal amplitude is sufficiently high to feed an electrically-controlled switch through a low-Q RC circuit. By decreasing the quality factor (also called Q-factor) of the RC feedback network by excluding inductive elements (that exist in RLC feedback networks in conventional class-E POs) a phase response of the feedback network may become almost flat around a nominal class-E frequency of an exemplary PO, and if a nominal class-E frequency of the resonant circuit changes due to variations in component values, the phase shift in the feedback network may almost remain unchanged, and therefore, the class-E operation of the circuit may be substantially maintained. As a result, robustness of an exemplary class-E PO against undesired variations in component values may be significantly improved, while power loss may be considerably decreased because of a reduced Q-factor of an exemplary feedback network.

Figure 1A:
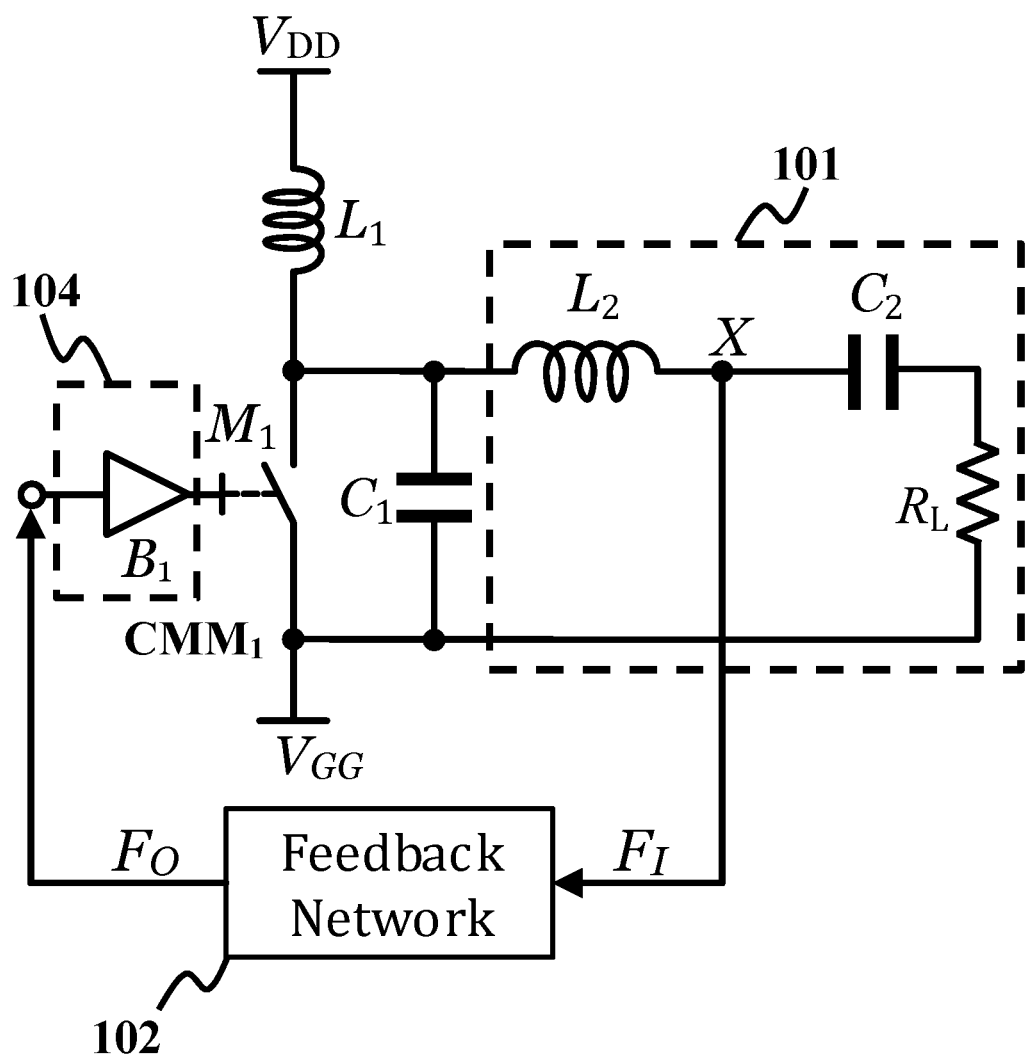
FIG. 1A shows a schematic of a class-E power oscillator (PO), consistent with one or more exemplary embodiments of the present disclosure.

FIG. 1A shows a schematic of a class-E power oscillator (PO), consistent with one or more exemplary embodiments of the present disclosure. An exemplary class-E PO 100A may include a first inductor $L_1$, a switch $M_1$, a first capacitor $C_1$, a resonant circuit 101, and a feedback network 102. In an exemplary embodiment, first inductor $L_1$ may be coupled in series to a first power supply $V_{DD}$. In an exemplary embodiment, switch $M_1$ may be connected between first inductor $L_1$ and a primary common node $CMM_1$. In an exemplary embodiment, first capacitor $C_1$ may be connected between first inductor $L_1$ and primary common node $CMM_1$.

In an exemplary embodiment, resonant circuit 101 may include a second inductor $L_2$, a second capacitor $C_2$, and a load resistor $R_L$. In an exemplary embodiment, second inductor $L_2$ may be connected between the first inductor $L_1$ and primary common node $CMM_1$. In an exemplary embodiment, second capacitor $C_1$ may be connected between first inductor $L_1$ and primary common node $CMM_1$, and may be coupled in series to second inductor $L_2$. In an exemplary embodiment, load resistor $R_L$ may be connected between first inductor $L_1$ and primary common node $CMM_1$, and may be coupled in series to second inductor $L_2$. In an exemplary embodiment, feedback network 102 may be connected between switch $M_1$ and a feedback node X. In an exemplary embodiment, feedback node X may be located between second inductor $L_2$ and second capacitor $C_2$. In an exemplary embodiment, an electrical signal at this node may have a large amplitude.

In an exemplary embodiment, feedback network 102 may include an RC circuit and may be configured to periodically turn switch $M_1$ on and off based on a resonance frequency of resonant circuit 101. In an exemplary embodiment, a switching period of switch $M_1$ may be determined based on an inverse of the resonance frequency. In an exemplary embodiment, an electrical signal at feedback node X may be fed to feedback network 102 at a feedback input terminal $F_I$ of feedback network 102 to obtain a feedback signal at a feedback output terminal $F_O$ of feedback network 102. In an exemplary embodiment, switch $M_1$ may turn on when an amplitude of the feedback signal exceeds a switching threshold (determined based on a type or a structure of switch $M_1$) at each switching period of switch $M_1$, and may turn off when the amplitude of the feedback signal decreases below the switching threshold. In an exemplary embodiment, feedback network 102 may include an RC circuit, which may provide a feedback network with a low Q-factor by excluding inductive elements (that exist in RLC feedback networks in conventional class-E POs) from feedback network 102. As a result, in an exemplary embodiment, the phase shift of feedback network 102, and consequently, power loss of class-E PO 100 may be considerably decreased because of a reduced Q-factor of feedback network 102, thereby increasing efficiency of class-E PO 100.

In an exemplary embodiment, class-E PO 100A may further include a driver circuit 104. In an exemplary embodiment, driver circuit 104 may be configured to couple feedback network 102 to switch $M_1$. In an exemplary embodiment, using a gate driver may simplify designing class-E PO 100 and may improve the performance of the class-E PO 100 as it may buffer nonlinear capacitance of switch $M_1$, which may be difficult to model. In an exemplary embodiment, driver circuit 104 may include a buffer $B_1$. In an exemplary embodiment, second inductor $L_2$ may be connected between first inductor $L_1$ and feedback node X.

Figure 1B:
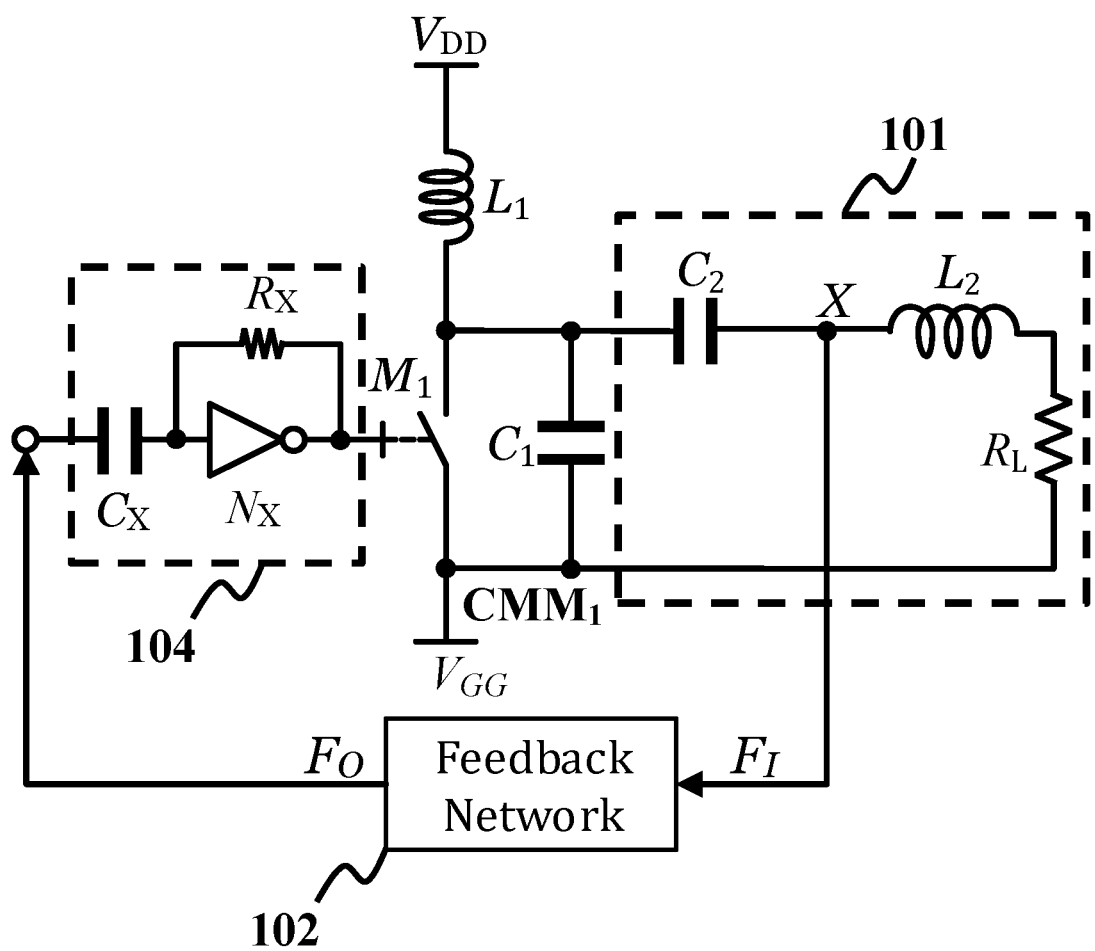
FIG. 1B shows a schematic of a class-E power PO in which a second capacitor is connected between a first inductor and a feedback node, consistent with one or more exemplary embodiments of the present disclosure.

FIG. 1B shows a schematic of a class-E power PO 100B in which second capacitor $C_1$ is connected between first inductor $L_1$ and feedback node X, consistent with one or more exemplary embodiments of the present disclosure. In an exemplary embodiment, driver circuit 104 may include an inverter $N_X$. In an exemplary embodiment, driver circuit 104 may further include a drive resistor $R_X$ and a drive capacitor $C_X$. In an exemplary embodiment, drive resistor $R_X$ may be coupled in parallel to inverter $N_X$. In an exemplary embodiment, drive capacitor $C_X$ may be configured to couple feedback network 102 to inverter $N_X$. In an exemplary embodiment, inverter $N_X$ may be used to drive switch $M_1$. In an exemplary embodiment, drive resistor $R_X$ may help class-E PO 100 start oscillating autonomously. In an exemplary embodiment, drive capacitor $C_X$ may be much larger than an input capacitance of driver circuit 104. In an exemplary embodiment, drive capacitor $C_X$ may decouple a DC bias of an output node of feedback network 102 from a DC bias of an input node of inverter $N_X$. In an exemplary embodiment, employing drive resistor $R_X$ and drive capacitor $C_X$ may minimize requirements of feedback network 102 circuit and may simplify an oscillation start-up in class-E PO 100.

Figure 1C:
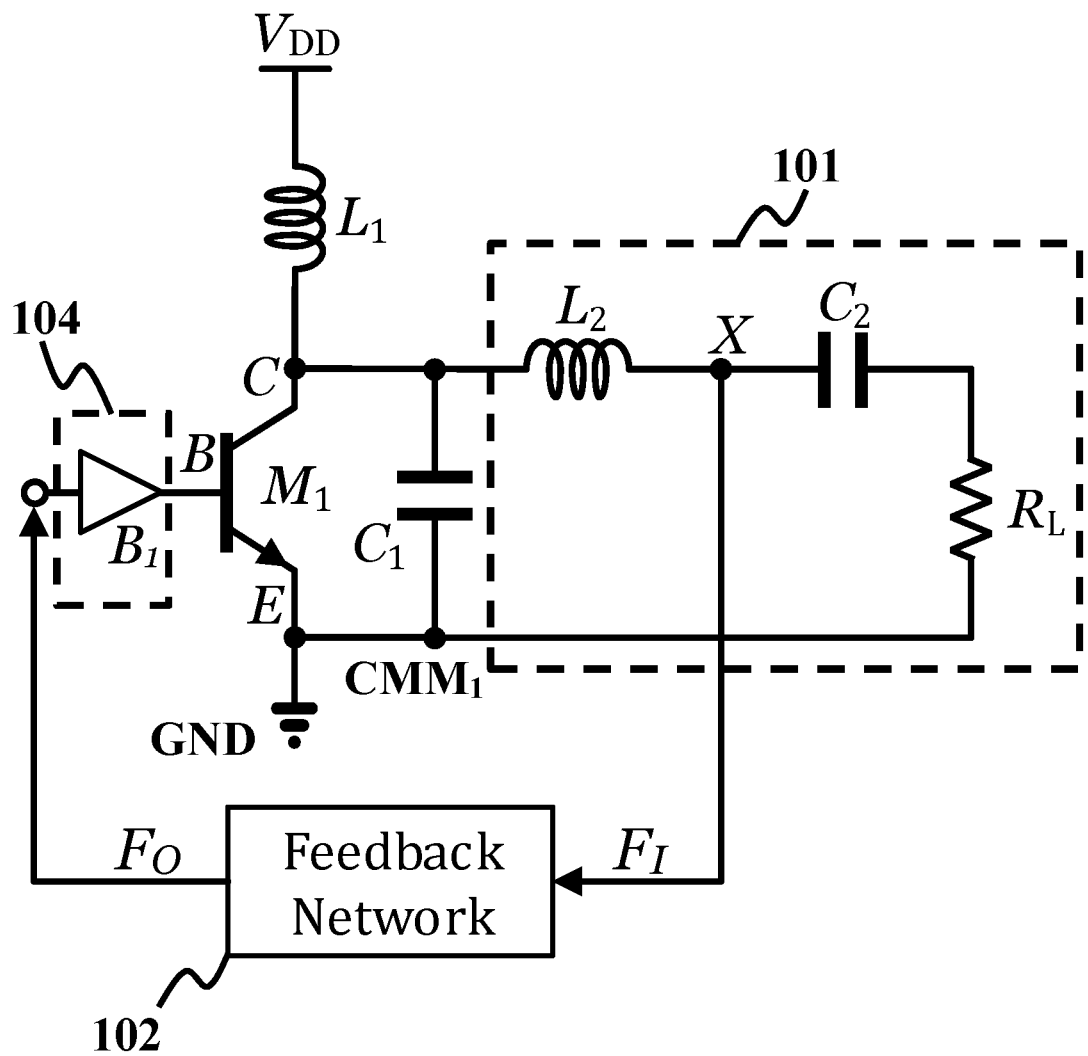
FIG. 1C shows a schematic of a class-E power PO with a bipolar junction transistor (BJT) switch, consistent with one or more exemplary embodiments of the present disclosure.

FIG. 1C shows a schematic of a class-E PO 100C with a bipolar junction transistor (BJT) switch, consistent with one or more exemplary embodiments of the present disclosure. In an exemplary embodiment, switch $M_1$ may include a BJT. In an exemplary embodiment, the BJT may include a base B, a collector C, and an emitter E. In an exemplary embodiment, base B may be connected to an output terminal of driver circuit 104. In an exemplary embodiment, collector C may be connected to first inductor $L_1$. In an exemplary embodiment, emitter E may be connected to a ground node GND via primary common node $CMM_1$.

Figure 1D:
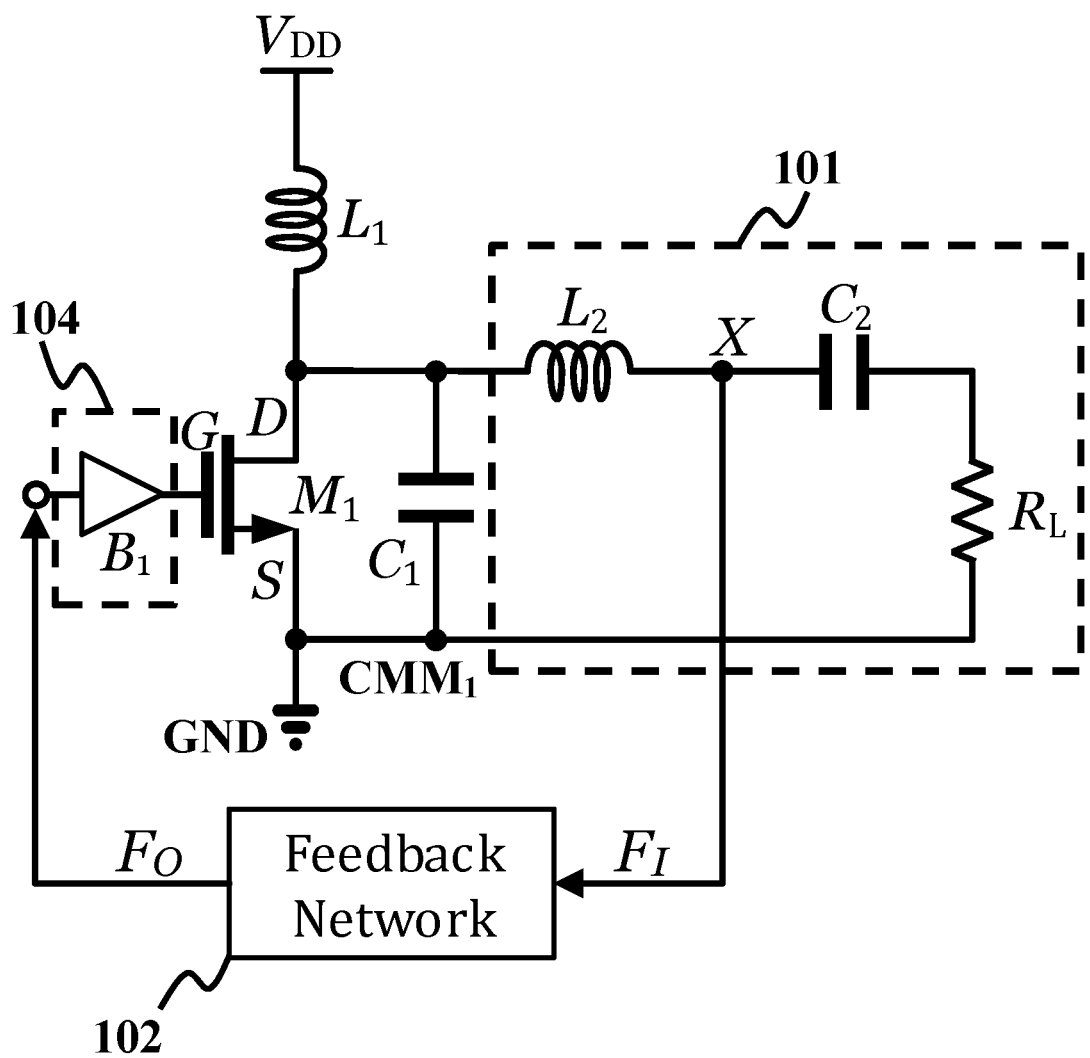
FIG. 1D shows a schematic of a class-E power PO with a field-effect transistor (FET) switch, consistent with one or more exemplary embodiments of the present disclosure.

FIG. 1D shows a schematic of a class-E power PO 100D with a field-effect transistor (FET) switch, consistent with one or more exemplary embodiments of the present disclosure. In an exemplary embodiment, the FET may include a metal-oxide-semiconductor field-effect transistor (MOSFET). An exemplary MOSFET may include a gate G, a drain D, and a source S. In an exemplary embodiment, gate G may be connected to an output terminal of driver circuit 104. In an exemplary embodiment, drain D may be connected to first inductor $L_1$. In an exemplary embodiment, source S may be connected to ground node GND via primary common node $CMM_1$.

In an exemplary embodiment, in a nominally-tuned Class-E PA or PO, a phase shift between fundamental components of the gate and drain signals of the MOSFET may be about −163.6°. This value is for the case that the duty cycle of the gate drive signal is about 50%. If the duty cycle is different from 50%, the phase shift may be different. For example, if the duty cycle is about 60%, the phase shift may be about −166.4°. At the same time, the phase shift from drain D to feedback node X, depending on the Q-factor and the value of $L_1/L_2$, may be in a range of about 50° to about 80°. Therefore, a feedback network that includes a single-pole RC circuit may provide enough phase shift to convert a Class-E PA to a Class-E PO.

Figure 1E:
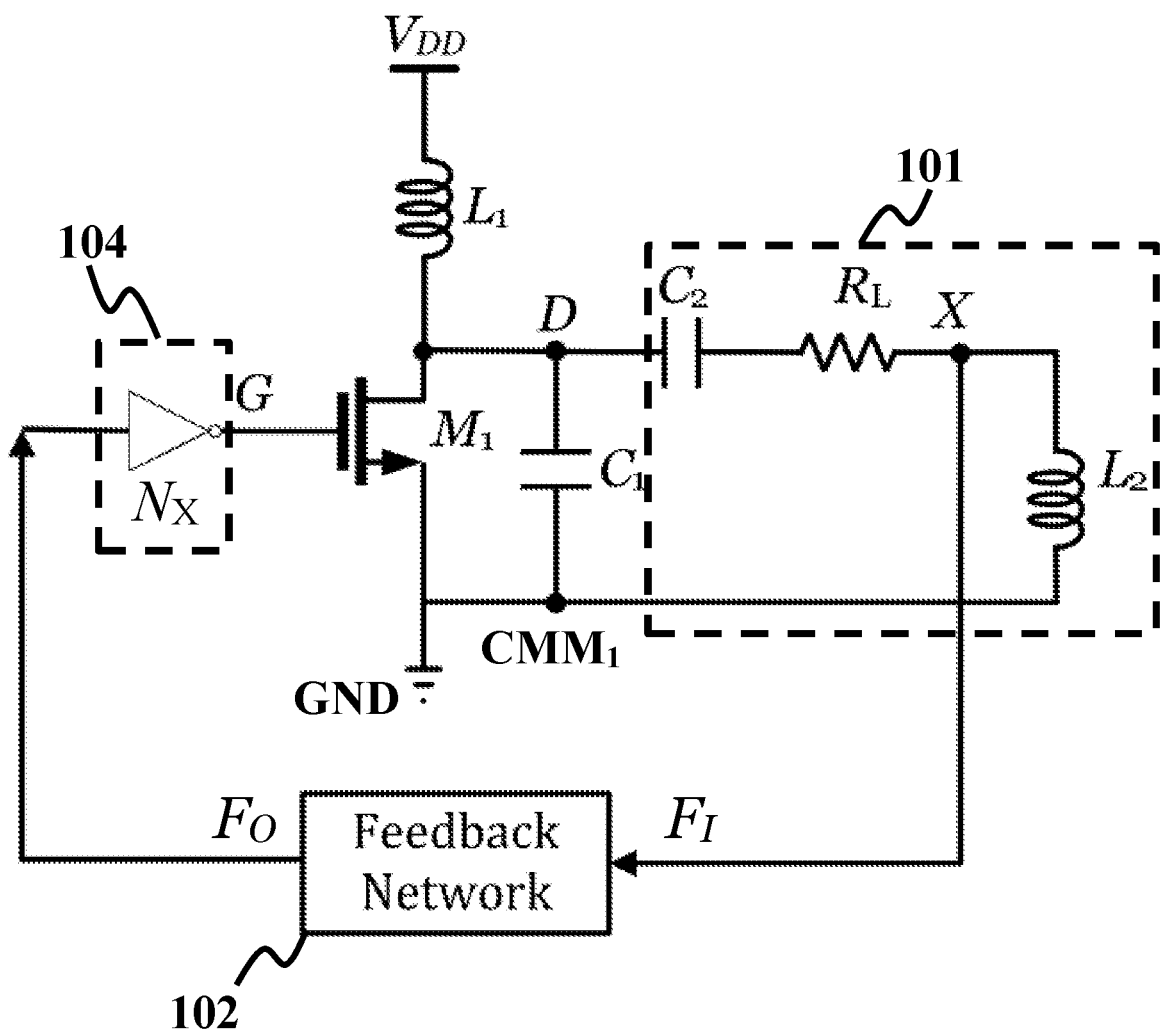
FIG. 1E shows a schematic of a class-E power PO with a load resistor connected between a second capacitor and second inductor in a resonant circuit, consistent with one or more exemplary embodiments of the present disclosure.

FIG. 1E shows a schematic of a class-E power PO 100E with load resistor $R_L$ connected between second capacitor $C_2$ and second inductor $L_2$ in resonant circuit 101, consistent with one or more exemplary embodiments of the present disclosure. In an exemplary embodiment, feedback node X may be located between load resistor $R_1$, and second inductor $L_2$. In an exemplary embodiment, if class-E PO 100E is nominally tuned, a phase shift from drain D to feedback node X may be in a range of about +37.8° and about +45.2°, depending on the Q-factor and the value of $L_1/L_2$. In an exemplary embodiment, if the duty cycle of the gate drive signal is about 50%, the phase shift from gate G to drain D may be about −163.6°. Therefore, in an exemplary embodiment, the phase shift from gate G to feedback node X may be between about −118.4° and about −125.8°, if the duty cycle of the gate drive signal is about 50%. As a result, feedback network 102 may provide a phase shift between about −234.4° and about −241.8°. In an exemplary embodiment, this amount of phase shift may be provided with an RC circuit that includes at least three capacitors (to generate a circuit with three frequency poles). Alternatively, inverter $N_X$ along with a single-pole RC circuit, may be utilized to provide the aforementioned amount of phase shift. In an exemplary embodiment, inverter $N_X$ may provide a phase shift of at least −180°, therefore the reminder of the phase shift, which may be between about −54.4° and about −61.8°, may be generated with a simple single-pole circuit.

Figure 1F:
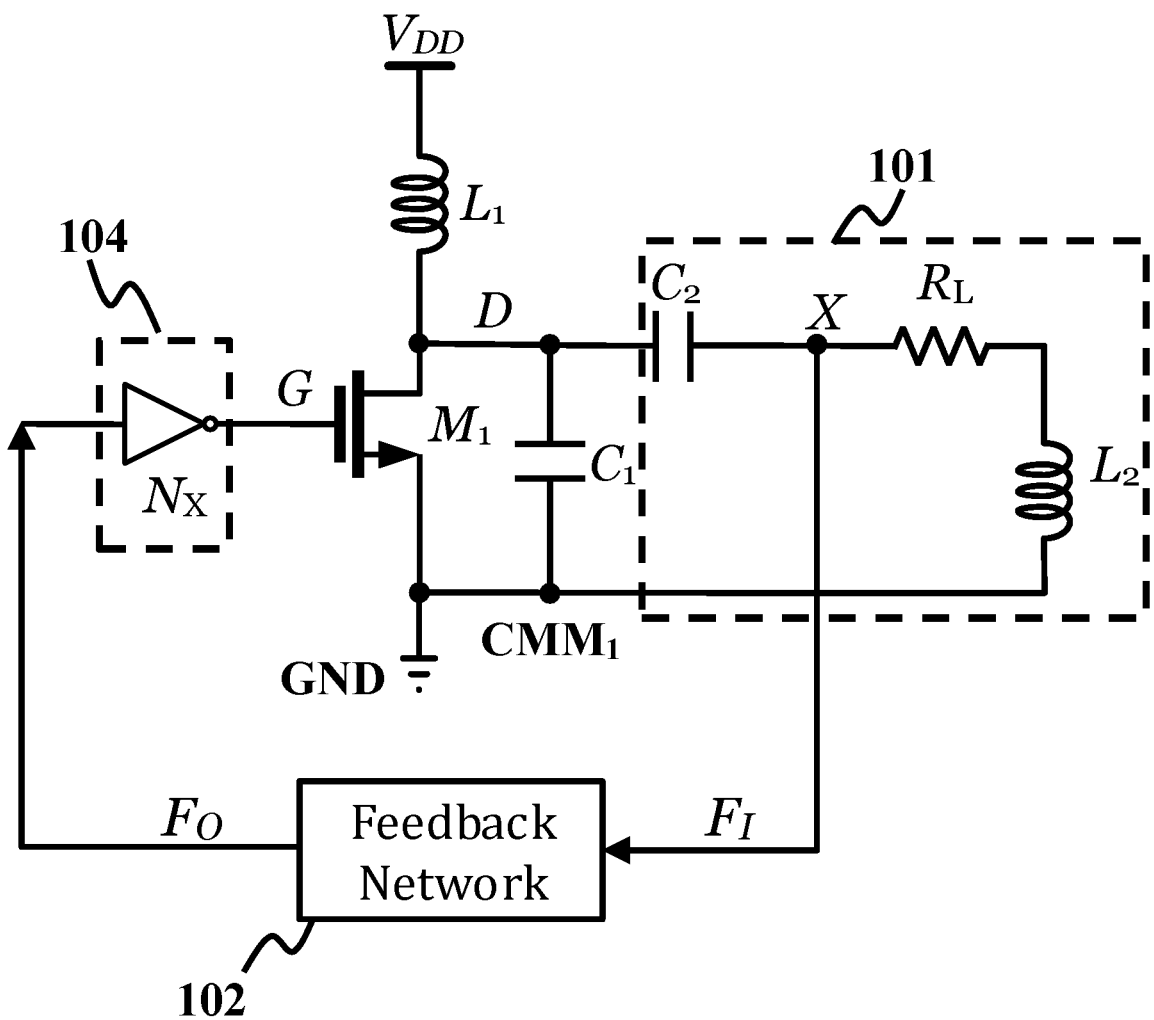
FIG. 1F shows a schematic of a class-E power PO with a feedback node between a second capacitor and a load resistor in a resonant circuit, consistent with one or more exemplary embodiments of the present disclosure.

FIG. 1F shows a schematic of a class-E power PO 100F with feedback node X between second capacitor $C_2$ and load resistor $R_L$ in resonant circuit 101, consistent with one or more exemplary embodiments of the present disclosure. In an exemplary embodiment, similar to class-E power PO 100E in FIG. 1E, feedback network 102 may include either a three-pole RC circuit or a single-pole RC circuit along with inverter $N_X$.

Figure 1G:
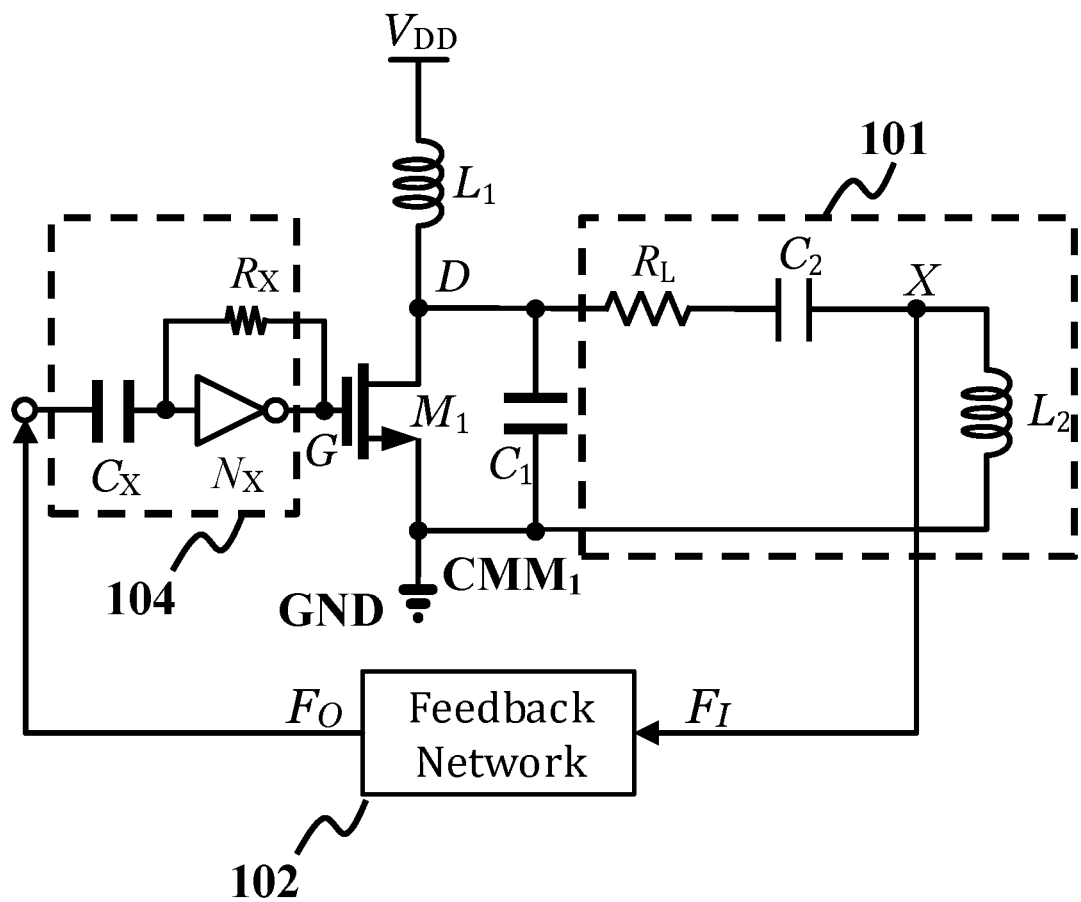
FIG. 1G shows a schematic of a class-E power PO with a resistor connected between a first inductor and a second capacitor, consistent with one or more exemplary embodiments of the present disclosure.

FIG. 1G shows a schematic of a class-E power PO 100G with load resistor $R_L$ connected between first inductor $L_1$ and second capacitor $C_2$, consistent with one or more exemplary embodiments of the present disclosure. In an exemplary embodiment, feedback network 102 may include either a three-pole RC circuit, or a single-pole RC circuit along with driver circuit 104. In an exemplary embodiment, load resistor $R_L$ may be placed in different locations in resonant circuit 101, and exemplary class-E power POs may show similar performances as long as feedback node X is located between second inductor $L_2$ and second capacitor $C_2$.

Figure 2A:
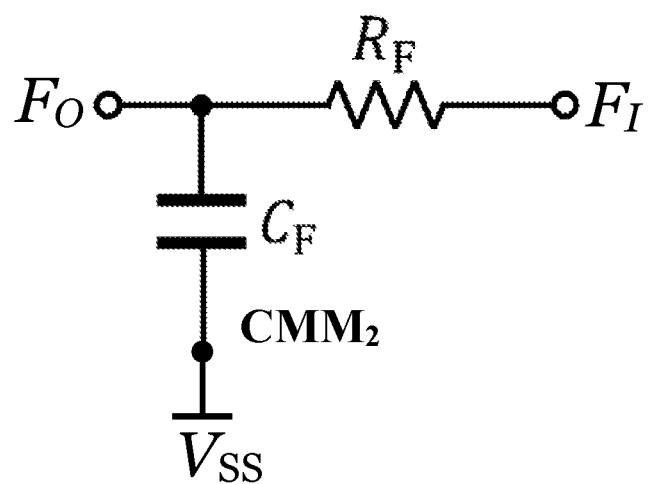
FIG. 2A shows a schematic of a first feedback network, consistent with one or more exemplary embodiments of the present disclosure.

FIG. 2A shows a schematic of a first feedback network, consistent with one or more exemplary embodiments of the present disclosure. An exemplary first feedback network 102A may include an implementation of feedback network 102. In an exemplary embodiment, first feedback network 102A may include a feedback input terminal $F_1$, a feedback output terminal $F_O$, a first feedback resistor $R_F$, and a feedback capacitor $C_F$. In an exemplary embodiment, feedback input terminal $F_1$ may be connected to feedback node X. In an exemplary embodiment, feedback output terminal $F_O$ may be coupled to driver circuit 104. In an exemplary embodiment, feedback capacitor $C_F$ may be connected between feedback input terminal $F_1$ and a secondary common node $CMM_2$. In an exemplary embodiment, secondary common node $CMM_2$ may be connected to one of a third power supply $V_{SS}$ or ground node GND. In an exemplary embodiment, first feedback resistor $R_F$ may be connected between feedback input terminal $F_1$ and secondary common node $CMM_2$. In an exemplary embodiment, one of feedback capacitor $C_F$ or first feedback resistor $R_F$ may be connected between feedback input terminal $F_1$ and feedback output terminal $F_O$. In an exemplary embodiment, one of feedback capacitor $C_F$ or first feedback resistor $R_F$ may be connected between feedback output terminal $F_O$ and secondary common node $CMM_2$. For example, as shown in FIG. 2A, first feedback resistor $R_F$ may be connected between feedback input terminal $F_1$ and feedback output terminal $F_O$, and feedback capacitor $C_F$ may be connected between feedback output terminal $F_O$ and secondary common node $CMM_2$.

Figure 2B:
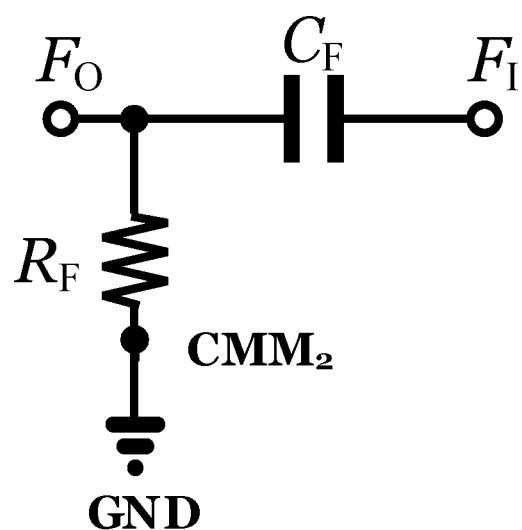
FIG. 2B shows a schematic of a second feedback network, consistent with one or more exemplary embodiments of the present disclosure.

FIG. 2B shows a schematic of a second feedback network, consistent with one or more exemplary embodiments of the present disclosure. An exemplary second feedback network 102B may include an implementation of first feedback network 102A. In an exemplary embodiment, as shown in FIG. 2B, feedback capacitor $C_F$ may be connected between feedback input terminal $F_1$ and feedback output terminal $F_O$ and first feedback resistor R may be connected between feedback output terminal $F_O$ and secondary common node $CMM_2$.

Figure 2C:
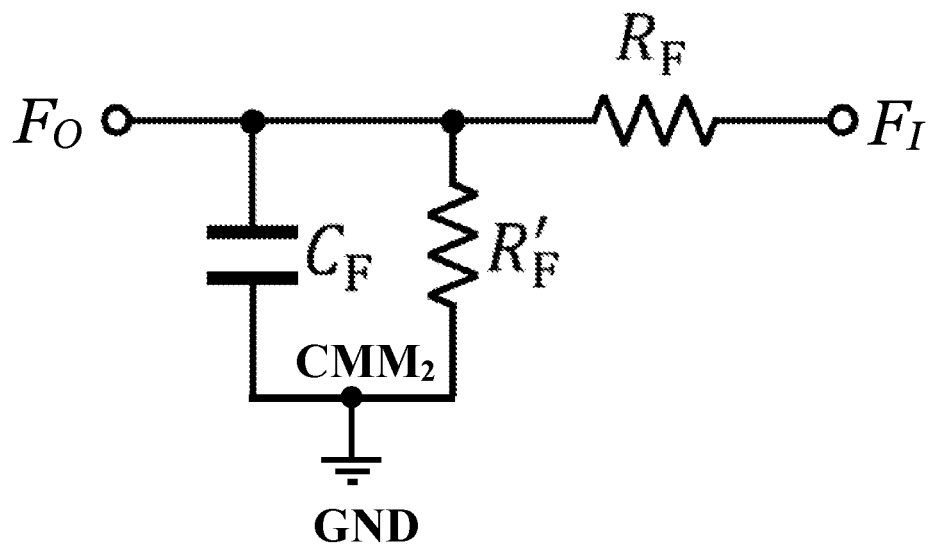
FIG. 2C shows a schematic of a third feedback network, consistent with one or more exemplary embodiments of the present disclosure.

FIG. 2C shows a schematic of a third feedback network, consistent with one or more exemplary embodiments of the present disclosure. An exemplary third feedback network 102C may include an implementation of feedback network 102. In an exemplary embodiment, third feedback network 102C may include elements similar to those of first feedback network 102A. In an exemplary embodiment, third feedback network 102C may further include a second feedback resistor $R'_F$. In an exemplary embodiment, second feedback resistor $R'_F$ may be connected in parallel with feedback capacitor $C_F$. In an exemplary embodiment, adding second feedback resistor $R'_F$ to first feedback network 102A may attenuate a signal amplitude at feedback node X, thereby preventing damage to switch $M_1$.

Figure 2D:
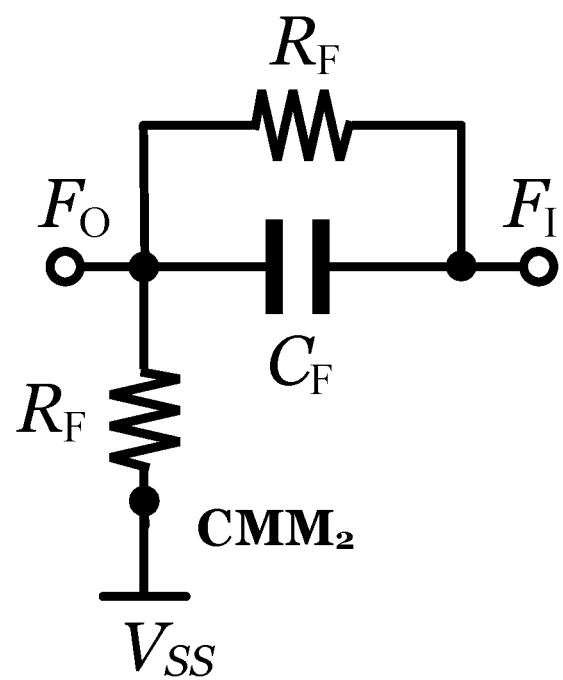
FIG. 2D shows a schematic of a fourth feedback network, consistent with one or more exemplary embodiments of the present disclosure.

FIG. 2D shows a schematic of a fourth feedback network, consistent with one or more exemplary embodiments of the present disclosure. An exemplary fourth feedback network 102D may include an implementation of feedback network 102. In an exemplary embodiment, fourth feedback network 102D may include elements similar to those of second feedback network 102B. In an exemplary embodiment, third feedback network 102C may further include second feedback resistor $R'_F$. In an exemplary embodiment, second feedback resistor $R'_F$ may be connected in parallel with feedback capacitor $C_F$. In an exemplary embodiment, adding second feedback resistor $R'_F$ to second feedback network 102B may attenuate a signal amplitude at feedback node X, thereby preventing damage to switch $M_1$.

Figure 2E:
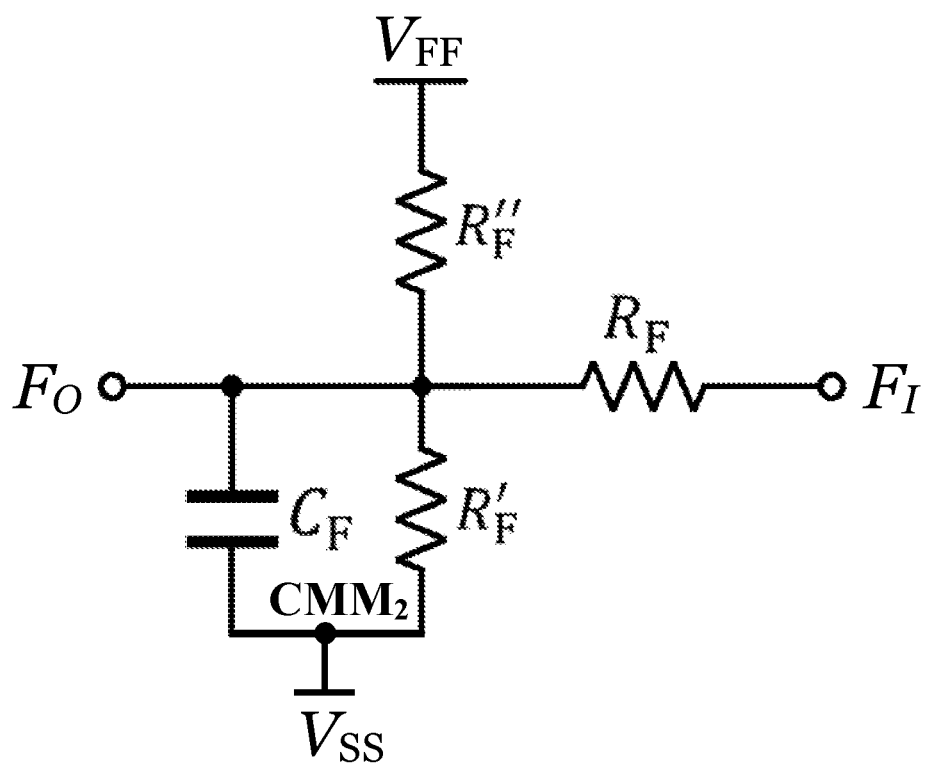
FIG. 2E shows a schematic of a fifth feedback network, consistent with one or more exemplary embodiments of the present disclosure.

FIG. 2E shows a schematic of a fifth feedback network, consistent with one or more exemplary embodiments of the present disclosure. An exemplary fifth feedback network 102E may include an implementation of feedback network 102. In an exemplary embodiment, fifth feedback network 102E may include elements similar to those of third feedback network 102C. In an exemplary embodiment, fifth feedback network 102E may further include a third feedback resistor $R_F''$. In an exemplary embodiment, third feedback resistor $R_F''$ may be connected between feedback output terminal $F_O$ and a fourth power supply $V_{FF}$. In an exemplary embodiment, fourth power supply $V_{FF}$ may provide similar voltage as first power supply $V_{DD}$, or may provide a different voltage. In an exemplary embodiment, adding third feedback resistor $R_F''$ to third feedback network 102C may provide enough flexibility to adjust phase shift, DC level, and amplitude of a signal at feedback output terminal $F_O$. Adjusting the DC signal level at feedback output terminal $F_O$ may help in determining a duty cycle of the switch $M_1$ drive signal.

Figure 2F:
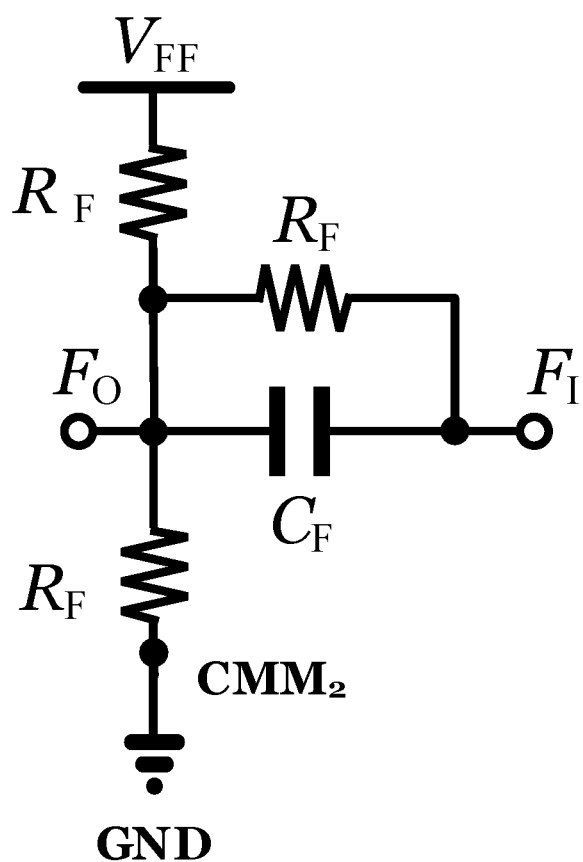
FIG. 2F shows a schematic of a sixth feedback network, consistent with one or more exemplary embodiments of the present disclosure.

FIG. 2F shows a schematic of a sixth feedback network, consistent with one or more exemplary embodiments of the present disclosure. An exemplary sixth feedback network 102F may include an implementation of feedback network 102. In an exemplary embodiment, sixth feedback network 102F may include elements similar to those of fourth feedback network 102D. In an exemplary embodiment, sixth feedback network 102F may further include third feedback resistor $R_F''$. In an exemplary embodiment, third feedback resistor $R_F''$ may be connected between feedback output terminal $F_O$ and fourth power supply $V_{FF}$. In an exemplary embodiment, fourth power supply $V_{FF}$ may provide similar voltage as first power supply $V_{DD}$, or may provide a different voltage. In an exemplary embodiment, adding third feedback resistor $R_F''$ to third feedback network 102D may provide enough flexibility to adjust phase shift, DC level, and amplitude of a signal that drives switch $M_1$. Adjusting the DC signal level at feedback output terminal $F_O$ may help in determining a duty cycle of the switch $M_1$ drive signal.

Figure 3:
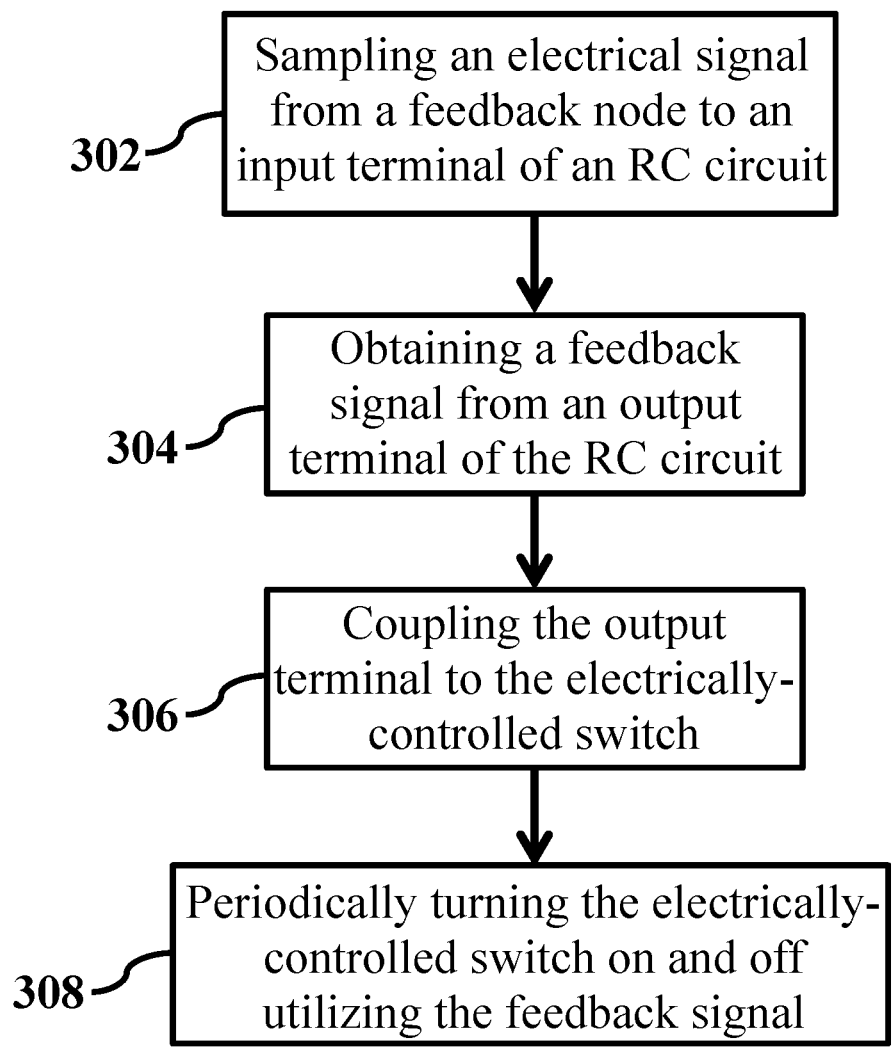
FIG. 3 shows a flowchart of a method for reducing sensitivity of a class-E power amplifier (PA), consistent with one or more exemplary embodiments of the present disclosure.

FIG. 3 shows a flowchart of a method for reducing sensitivity of a class-E power amplifier (PA), consistent with one or more exemplary embodiments of the present disclosure. An exemplary class-E PA may include an electrically-controlled switch and a resonant circuit. Referring to FIGS. 1A-1D, in an exemplary embodiment, the electrically-controlled switch may be analogous to switch $M_1$, and the resonant circuit may be analogous to resonant circuit 101. In an exemplary embodiment, the resonant circuit may include an inductor and a capacitor that may be coupled in series. In an exemplary embodiment, the inductor may be analogous to second inductor $L_2$ and the capacitor may be analogous to second capacitor $C_2$. An exemplary method 300 may include feeding an electrical signal from a feedback node to an input terminal of an RC circuit (step 302), obtaining a feedback signal from an output terminal of the RC circuit (step 304), coupling the output terminal to the electrically-controlled switch (step 306), and periodically turning the electrically-controlled switch on and off utilizing the feedback signal based on a resonance frequency of the resonant circuit (step 308). In an exemplary embodiment, the feedback node may be analogous to feedback node X and may be located between the capacitor and the inductor. In an exemplary embodiment, the RC circuit may be analogous to feedback network 102.

EXAMPLE

Figure 4A:
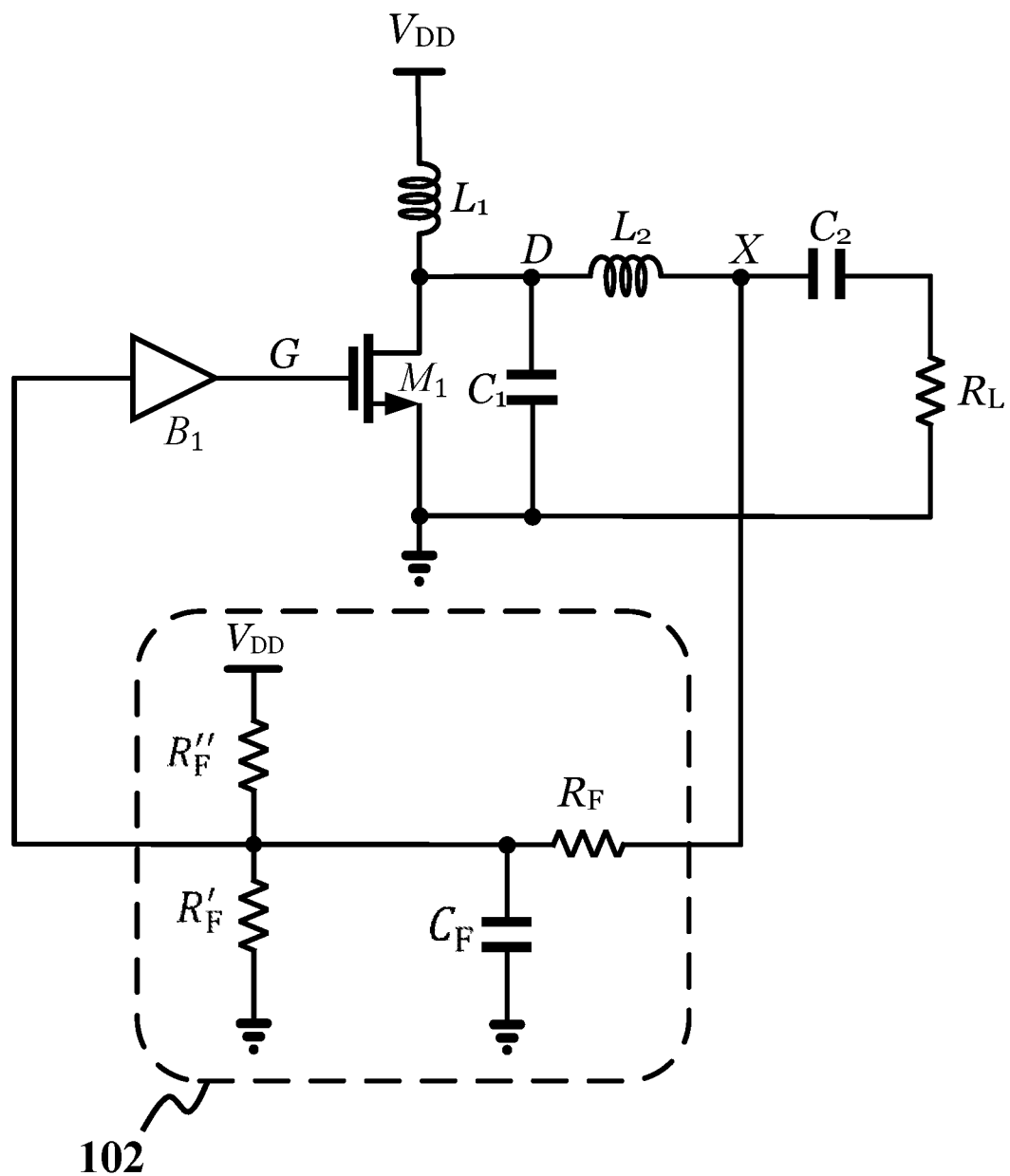
FIG. 4A shows a schematic of a class-E power PO with exemplary specifications, consistent with one or more exemplary embodiments of the present disclosure.

In this example, performance of an exemplary class-E PO analogous to class-E PO 100 is demonstrated. FIG. 4A shows a schematic of a class-E power PO 400 with exemplary specifications, consistent with one or more exemplary embodiments of the present disclosure. Table 1 shows a list of specifications and approximate component values for which class-E power PO 400 is designed. An FQT13n061 transistor is used for implementing switch $M_1$ and a 74AC244 buffer is used for implementing buffer $B_1$.

TABLE 1

| | |
|---|---|
| Output Power, $P_O$ | 1.0 W |
| Supply Voltage, $V_{DD}$ | 4.5 V |
| Operating Frequency, $f_c$ | 800 kHz |
| Loaded Q-Factor, $Q_L$ | 13 |
| $L_1$ | 0.9 mH |
| $L_2$ | 27.74 mH |
| $C_1$ | 3.56 nF |
| $C_2$ | 1565 pF |
| $R_L$ | 10.3 Ω |
| $R_F$ | 30.9 kΩ |
| $R'_F$ | 7 kΩ |
| $R''_F$ | 9.1 kΩ |
| $C_F$ | 106 pF |

Figure 4B:
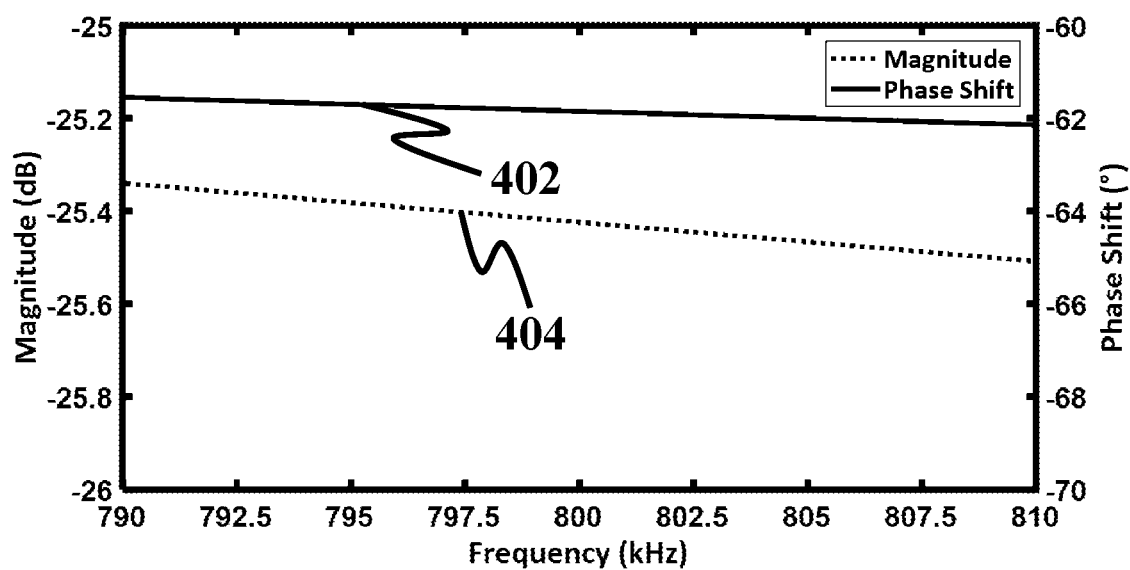
FIG. 4B shows phase and magnitude responses of a feedback network in a class-E power oscillator, consistent with one or more exemplary embodiments of the present disclosure.

FIG. 4B shows phase and magnitude responses of a feedback network in class-E PO 400, consistent with one or more exemplary embodiments of the present disclosure. Variations in a phase shift 402 of feedback network 102 is less than about 0.5° in a frequency range of about 790 kHz to about 810 kHz. Also, a change in a magnitude response 404 of feedback network 102 is less than about 0.2 dB, which indicates high robustness against variations in the component values of Class-E PO 400.

Figure 4C:
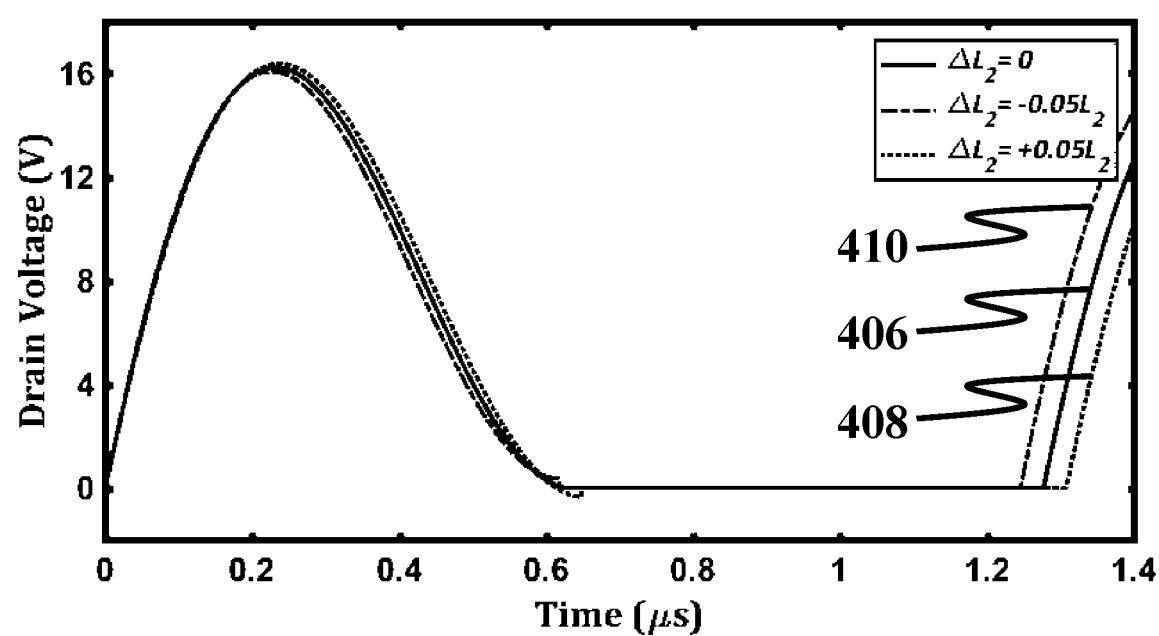
FIG. 4C shows drain voltage waveforms of a class-E PO, consistent with one or more exemplary embodiments of the present disclosure.

FIG. 4C shows drain voltage waveforms of class-E PO 400, consistent with one or more exemplary embodiments of the present disclosure. A waveform 406 shows a voltage waveform of drain D for a nominal value of second inductor $L_2$, i.e., zero variation $\Delta L_2$ in the inductance of second inductor $L_2$. Waveforms 408 and 410 show voltage waveforms of drain D for $\Delta L_2 = 0.05 L_2$ and $\Delta L_2 = -0.05 L_2$, respectively. When $L_2$ and other components have their nominal value, an output power and power efficiency are respectively about 1 W and about 95%. Major sources of power loss in this case are an equivalent series resistance (ESR) of $L_2$, an on-resistance of switch $M_1$, and an AC power loss in feedback network 102.

When $L_2$ increases by about 5%, the output power decreases by only about 3.12% and the efficiency changes by only about −0.1%. When $L_2$ decreases by 5%, the output power increases by only about 3.55% and the power efficiency changes by only about 0.37%. This experiment demonstrates resilience of class-E PO 400 against changes in the value of $L_2$. As seen here, the output power and the power efficiency of the class-E PO 400 have very small sensitivity to the value of $L_2$. Similarly, class-E PO 400 has small sensitivities to values of other circuit components.

Advantages of class-E PO 400 are due to the fact that feedback network 102 is a low-Q circuit, in which phase response 402 and magnitude response 404, as shown FIG. 4B, are almost flat around the class-E frequency, and if the class-E frequency changes for whatever reason, the change in the phase and magnitude of transfer function of feedback network 102 may be very small and the power oscillator may stay close to its nominal class-E operation. In addition, because feedback network 102 is not a resonant circuit, it does not have a specific resonance frequency that may interfere with the resonance and the class-E frequency of class-E PO 400. As a result, the output power and the efficiency of class-E PO 400 have negligible sensitivities to component variations and if the values of the circuit components change, the circuit may move towards its nominal class-E operation.

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A class-E power oscillator (PO), comprising:
a first inductor coupled in series to a first power supply;
a switch connected between the first inductor and a primary common node, the primary common node connected to one of a second power supply or ground;
a first capacitor connected between the first inductor and the primary common node;
a resonant circuit comprising:
    a second inductor connected between the first inductor and the primary common node;
    a second capacitor connected between the first inductor and the primary common node, the second capacitor coupled in series to the second inductor; and
    a resistor connected between the first inductor and the primary common node, the resistor coupled in series to the second inductor and the second capacitor; and
a feedback network connected between the switch and a feedback node located between the second inductor and the second capacitor, the feedback network comprising an RC circuit, the feedback network configured to periodically turn the switch on and off based on a resonance frequency of the resonant circuit;
wherein the resistor, the second inductor, and the second capacitor are connected in series.

2. The class-E PO of claim 1, further comprising a driver circuit configured to couple the feedback network to the switch.

3. The class-E PO of claim 2, wherein:
the driver circuit comprises a buffer; and
the second inductor is connected between the first inductor and the feedback node.

4. The class-E PO of claim 2, wherein the driver circuit comprises an inverter.

5. The class-E PO of claim 4, wherein the second capacitor is connected between the first inductor and the feedback node.

6. The class-E PO of claim 4, wherein the driver circuit further comprises:
a drive resistor coupled in parallel to the inverter; and
a drive capacitor configured to couple the feedback network to the inverter.

7. The class-E PO of claim 1, wherein the switch comprises one of a field-effect transistor (FET) or a bipolar junction transistor (BJT).

8. The class-E PO of claim 7, wherein the FET comprises a metaloxide-semiconductor field-effect transistor (MOSFET), the MOSFET comprising:
a gate connected to an output terminal of the driver circuit;
a drain connected to the first inductor; and
a source connected to the primary common node.

9. The class-E PO of claim 7, wherein the BJT comprises:
a base connected to an output terminal of the driver circuit;
a collector connected to the first inductor; and
an emitter connected to the primary common node.

10. The class-E PO of claim 1, wherein the feedback network comprises:
a feedback input terminal connected to the feedback node;
a feedback output terminal connected to the driver circuit;
a feedback capacitor connected between the feedback input terminal and a secondary common node, the secondary common node connected to one of a third power supply or ground; and
a first feedback resistor connected between the feedback input terminal and the secondary common node;
wherein:
one of the feedback capacitor or the first feedback resistor is connected between the feedback input terminal and the feedback output terminal; and
one of the feedback capacitor or the first feedback resistor is connected between the feedback output terminal and the secondary common node.

11. The class-E PO of claim 10, wherein the feedback network further comprises a second feedback resistor connected in parallel with the feedback capacitor.

12. The class-E PO of claim 11, wherein the feedback network further comprises a third feedback resistor connected between the feedback output terminal and a fourth power supply.

13. A method for reducing sensitivity of a class-E power amplifier (PA) comprising an electrically-controlled switch and a resonant circuit, the resonant circuit comprising an inductor and a capacitor coupled in series, the method comprising:
coupling a resistor in series to the inductor in the resonant circuit;
coupling the resistor in series to the capacitor in the resonant circuit;
feeding an electrical signal from a feedback node located between the capacitor and the inductor to an input terminal of a feedback network;
obtaining a feedback signal from an output terminal of the RC circuit;
coupling the output terminal to the electrically-controlled switch; and
periodically turning the electrically-controlled switch on and off utilizing the feedback signal based on a resonance frequency of the resonant circuit.

14. The method of claim 13, wherein obtaining the feedback signal from the output terminal of the feedback network comprises:
connecting a first feedback resistor between the input terminal and the output terminal;
connecting a feedback capacitor between the output terminal and ground;
connecting a second feedback resistor between the output terminal and ground; and
connecting a third feedback resistor between the output terminal and a power supply.

15. The method of claim 13, wherein obtaining the feedback signal from the output terminal of the feedback network comprises:
connecting a feedback capacitor between the input terminal and the output terminal;
connecting a first feedback resistor between the output terminal and ground;
connecting a second feedback resistor between the input terminal and the output terminal; and
connecting a third feedback resistor between the output terminal and a power supply.

16. The method of claim 13, further comprising coupling the output terminal to the electrically-controlled switch through a buffer.

17. The method of claim 13, further comprising coupling the output terminal to the electrically-controlled switch through a driver circuit comprising:
an inverter;
a drive resistor coupled in parallel to the inverter; and
a drive capacitor connected between the output terminal and the inverter.

18. The method of claim 13, wherein coupling the output terminal to the electrically-controlled switch comprises coupling the output terminal to one of a gate of a field-effect transistor (FET) or a base of a bipolar junction transistor (BJT).

19. The method of claim 13, wherein feeding the electrical signal from the feedback node to the input terminal of the feedback network comprises feeding the electrical signal to an input terminal of an RC circuit.

* * * * *